(12) United States Patent
Chen et al.

(10) Patent No.: US 8,729,965 B2
(45) Date of Patent: May 20, 2014

(54) AMPLIFIER CIRCUITS AND MODULATION SIGNAL GENERATING CIRCUITS THEREIN

(75) Inventors: Wei-Zen Chen, Hsinchu County (TW); Chun-Pao Lin, Taipei (TW)

(73) Assignee: Princeton Technology Corporation, New Taipei (TW)

( * ) Notice: Subject to any disclaimer, the term of this patent is extended or adjusted under 35 U.S.C. 154(b) by 52 days.

(21) Appl. No.: 13/563,352

(22) Filed: Jul. 31, 2012

(65) Prior Publication Data

US 2013/0033319 A1 Feb. 7, 2013

(30) Foreign Application Priority Data

Aug. 1, 2011 (TW) .............................. 100127174 A

(51) Int. Cl.
*H03F 3/217* (2006.01)
*H03K 7/00* (2006.01)

(52) U.S. Cl.
USPC .......................................... 330/251; 332/106

(58) Field of Classification Search
USPC .................................... 331/251; 332/106, 109
See application file for complete search history.

(56) References Cited

U.S. PATENT DOCUMENTS 6,621,335 B2 * 9/2003 Andersson ....................... 330/10
7,545,207 B2 * 6/2009 Chang et al. .................... 330/10

* cited by examiner

*Primary Examiner* — Joseph Chang
(74) *Attorney, Agent, or Firm* — Muncy, Geissler, Olds, Lowe, P.C.

(57) ABSTRACT

An amplifier circuit includes a modulation signal generating circuit, a driving stage circuit and an output stage circuit. The modulation signal generating circuit generates a pair of modulation signals according to a pair of differential input signals and a pair of clock signals. The pair of clock signals includes a first clock signal and a second clock signal having a phase difference therebetween. The driving stage circuit generates a pair of driving signals according to the pair of modulation signals. The output stage circuit generates a pair of amplified output signals according to the pair of driving signals.

12 Claims, 16 Drawing Sheets

AMPLIFIER CIRCUITS AND MODULATION SIGNAL GENERATING CIRCUITS THEREIN

CROSS REFERENCE TO RELATED APPLICATIONS

This application claims priority of Taiwan Patent Application No. 100127174, filed on Aug. 1, 2011, the entirety of which is incorporated by reference herein.

BACKGROUND OF THE INVENTION

1. Field of the Invention

The invention relates to an amplifier circuit, and more particularly to a two-order amplifier circuit with high stability and low signal distortion.

2. Description of the Related Art

Along with the developments in portable electronic technology, a variety of related products (such as the cell phone, personal digital assistance, tablet computer, or others) are becoming increasingly diverse. In addition, the multimedia streaming service has become one of the essential functions that are commonly provided by the portable electronic devices. Therefore, a high efficiency and low power consumption power amplifier is highly required by the portable electronic devices. In recent years, the class D amplifier has replaced the class AB amplifier and become a preferred choice as an audio power amplifier due to its merits of having a small circuit area and a 90% high amplifying efficiency. The class D amplifier is especially preferable for small sized portable electronic devices.

The class D amplifier is also called a digital power amplifier, which can output digitalized and amplified signals by modulating and amplifying the input analog signals. FIG. 1 shows a basic circuit diagram of a class D amplifier, in which the input signal Vin is modulated by the PWM (Pulse Width Modulation) modulator as the digital signals. The digital signals are then amplified by the power transistors Q1 and Q2, and the amplified digital signals are filtered by a low pass filter so as to filter out the original input audio signal to be played by the loud speaker.

Because the inputs of the power transistors are digital signals, the power transistors Q1 and Q2 work in the saturated or cut-off regions. Therefore, the power consumption of the power transistors Q1 and Q2 is very small, which may improve the overall efficiency of the power amplifier and reduce the area required by the heat dissipation devices. For these reasons, the circuit area of the class D power amplifier can be greatly reduced. In addition, the amplifying efficiency of a class AB amplifier is only 50%, while the amplifying efficiency of a class D amplifier can be as high as 90%, or even close to 100%. Thus, the class D amplifier has become commonly used in the audio power amplifier field.

Because probable electronic devices are usually used very close to a human body, the Electromagnetic Disturbance (EMI) generated by the probable electronic device must meet statutory standards and should be as small as possible.

Therefore, a two-order amplifier circuit with high stability and low signal distortion, which can reduce EMI and reduce the distortion in the amplified signals, is highly required.

BRIEF SUMMARY OF THE INVENTION

Amplifier circuits and modulation signal generating circuits are provided. An exemplary embodiment of an amplifier circuit comprises a modulation signal generating circuit, a driving stage circuit and an output stage circuit. The modulation signal generating circuit generates a pair of modulation signals according to a pair of differential input signals and a pair of clock signals. The pair of clock signals comprises a first clock signal and a second clock signal having a phase difference therebetween. The driving stage circuit generates a pair of driving signals according to the pair of modulation signals. The output stage circuit generates a pair of amplified output signals according to the pair of driving signals.

An exemplary embodiment of a modulation signal generating circuit comprises a two-order integration circuit, a comparator circuit and a logic circuit. The two-order integration circuit generates a plurality of pairs of integration signals according to a pair of differential input signals and a pair of clock signals. The pair of clock signals comprises a first clock signal and a second clock signal having a phase difference therebetween. The comparator circuit compares the pairs of integration signals to generate a pair of comparison signals. The logic circuit generates a pair of modulation signals according to logic operation results of the pair of comparison signals.

Another exemplary embodiment of a modulation signal generating circuit comprises a first order integration circuit, a second order integration circuit, a comparator circuit and a logic circuit. The first order integration circuit generates a first pair of integration signals according to a pair of differential input signals. The second order integration circuit generates a second pair of integration signals and a third pair of integration signals according to the first pair of integration signals and a pair of clock signals. The comparator circuit compares the second and third pairs of integration signals to generate a pair of comparison signals. The logic circuit generates a pair of modulation signals according to logic operation results of the pair of comparison signals.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 10a shows exemplary waveform of the comparison signal $S_{Cmp1}$ generated based on the integration signals as shown in FIG. 9a;

FIG. 13a shows exemplary waveform of the comparison signal $S_{Cmp1}$ generated based on the integration signals as shown in FIG. 12a;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
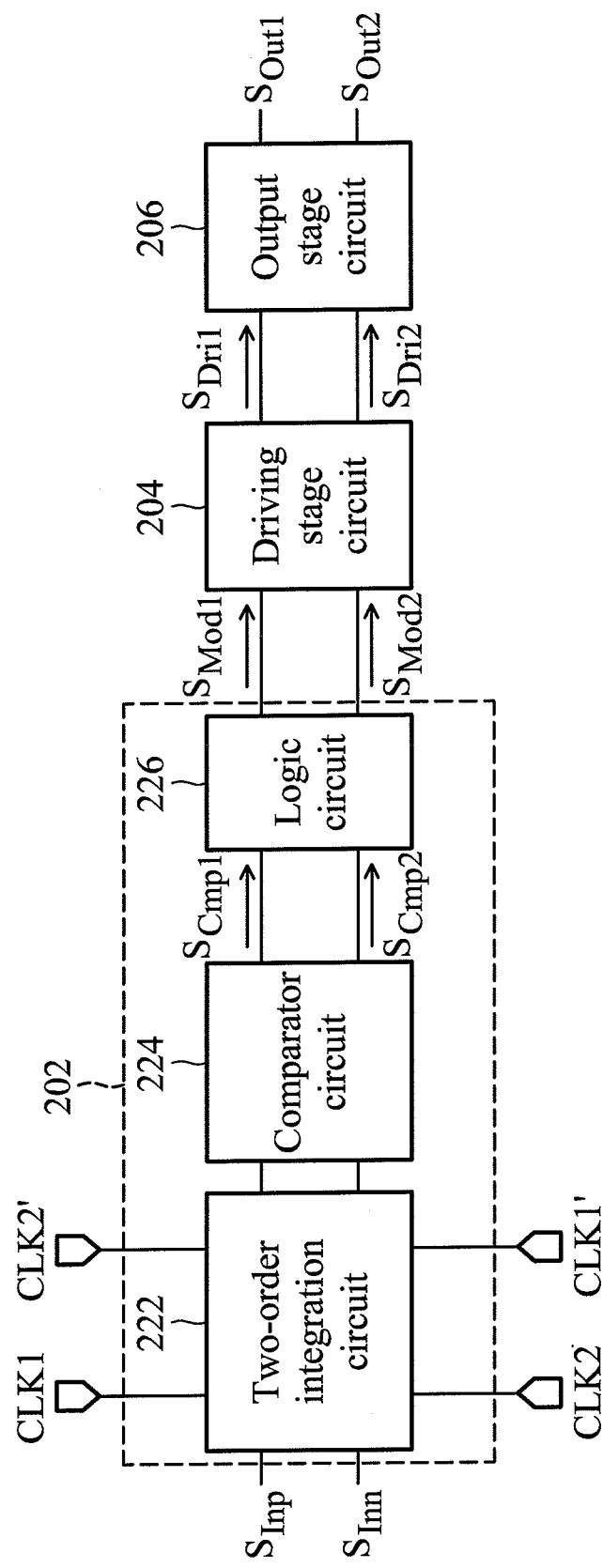
FIG. 2 is a block diagram of an amplifier circuit according to an embodiment of the invention.

FIG. 2 is a block diagram of an amplifier circuit according to an embodiment of the invention. The proposed amplifier circuit may be a two-order class BD amplifier, which comprises the characteristics of both of the class B and class D amplifiers and can greatly reduce the EMI of the amplified output signals and also reduce the distortion in the amplified output signals. As shown in FIG. 2, the amplifier circuit 200 comprises a modulation signal generating circuit 202, a driving stage circuit 204 and an output stage circuit 206. The modulation signal generating circuit 202 generates a pair of modulation signals $S_{Mod1}$ and $S_{Mod2}$ according to a pair of differential input signals $S_{Inp}$ and $S_{Inn}$ and a pair of clock signals CLK1/CLK1' and CLK2/CLK2'. The driving stage circuit 204 generates a pair of driving signals $S_{Dri1}$ and $S_{Dri2}$ according to the pair of modulation signals $S_{Mod1}$ and $S_{Mod2}$, respectively. The output stage circuit 206 generates a pair of amplified output signals $S_{Out1}$ and $S_{Out2}$ according to the pair of driving signals $S_{Dri1}$ and $S_{Dri2}$, respectively.

Figure 3:
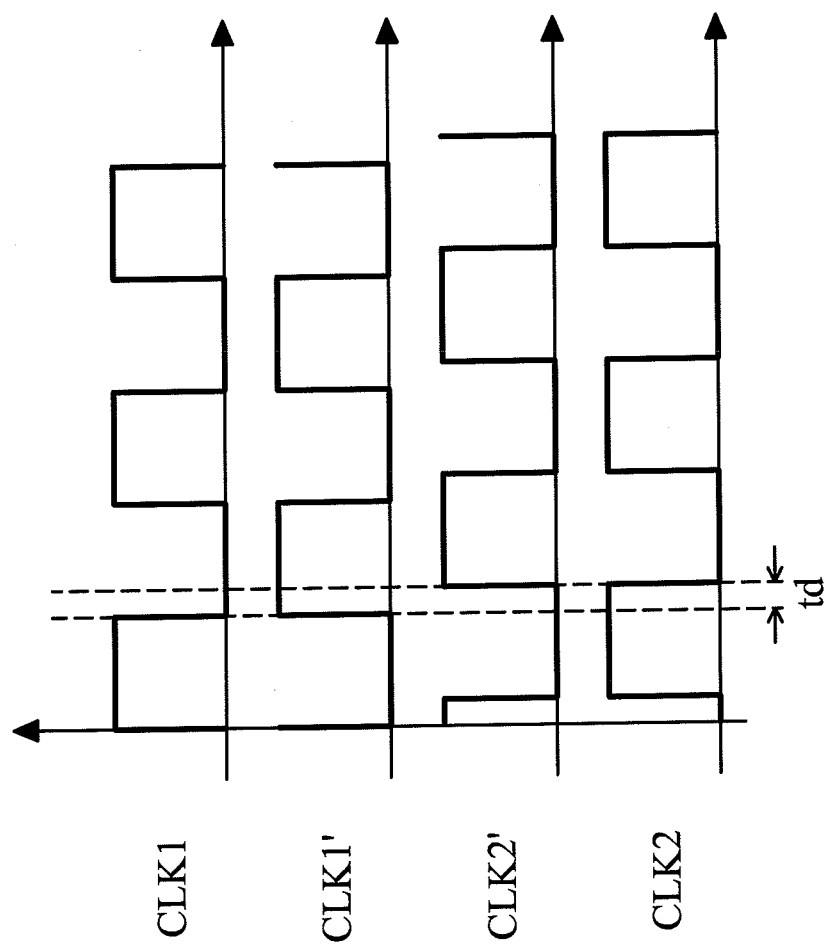
FIG. 3 shows the waveforms of the clock signals according to an embodiment of the invention.

According to an embodiment of the invention, there is a phase difference td between the clock signals CLK1 and CLK2. FIG. 3 shows the waveforms of the clock signals according to an embodiment of the invention. The clock signal CLK1' is complementary to the clock signal CLK1, and the clock signal CLK2' is complementary to the clock signal CLK2. There is a phase difference td between the clock signals CLK1 and CLK2 and there is also a phase difference td between the clock signals CLK1' and CLK2'. According to an embodiment of the invention, the phase difference td may be arbitrarily determined as a value greater than a sum of an overall propagation delay of the amplifier circuit 200 and a dead time of the output stage circuit 204. The overall propagation delay may be determined by the electronic properties of the elements comprised in the amplifier circuit 200, and the dead time may be determined by the ON/OFF time of the power transistors comprised in the output stage circuit 206 (reference may be made to FIG. 4).

Referring back to FIG. 2, according to an embodiment of the invention, the modulation signal generating circuit 202 may comprise a two-order integration circuit 222, a comparator circuit 224 and a logic circuit 226. The two-order integration circuit 222 generates a plurality of pairs of integration signals according to the pair of differential input signals $S_{Inp}$ and $S_{Inn}$ and the pair of clock signals CLK1/CLK1' and CLK2/CLK2'. The comparator circuit 224 compares the pairs of integration signals to generate a pair of comparison signals $S_{Cmp1}$ and $S_{Cmp2}$. The logic circuit 226 generates the pair of modulation signals $S_{Mod1}$ and $S_{Mod2}$ according to logic operation results of the pair of comparison signals $S_{Cmp1}$ and $S_{Cmp2}$.

Figure 4:
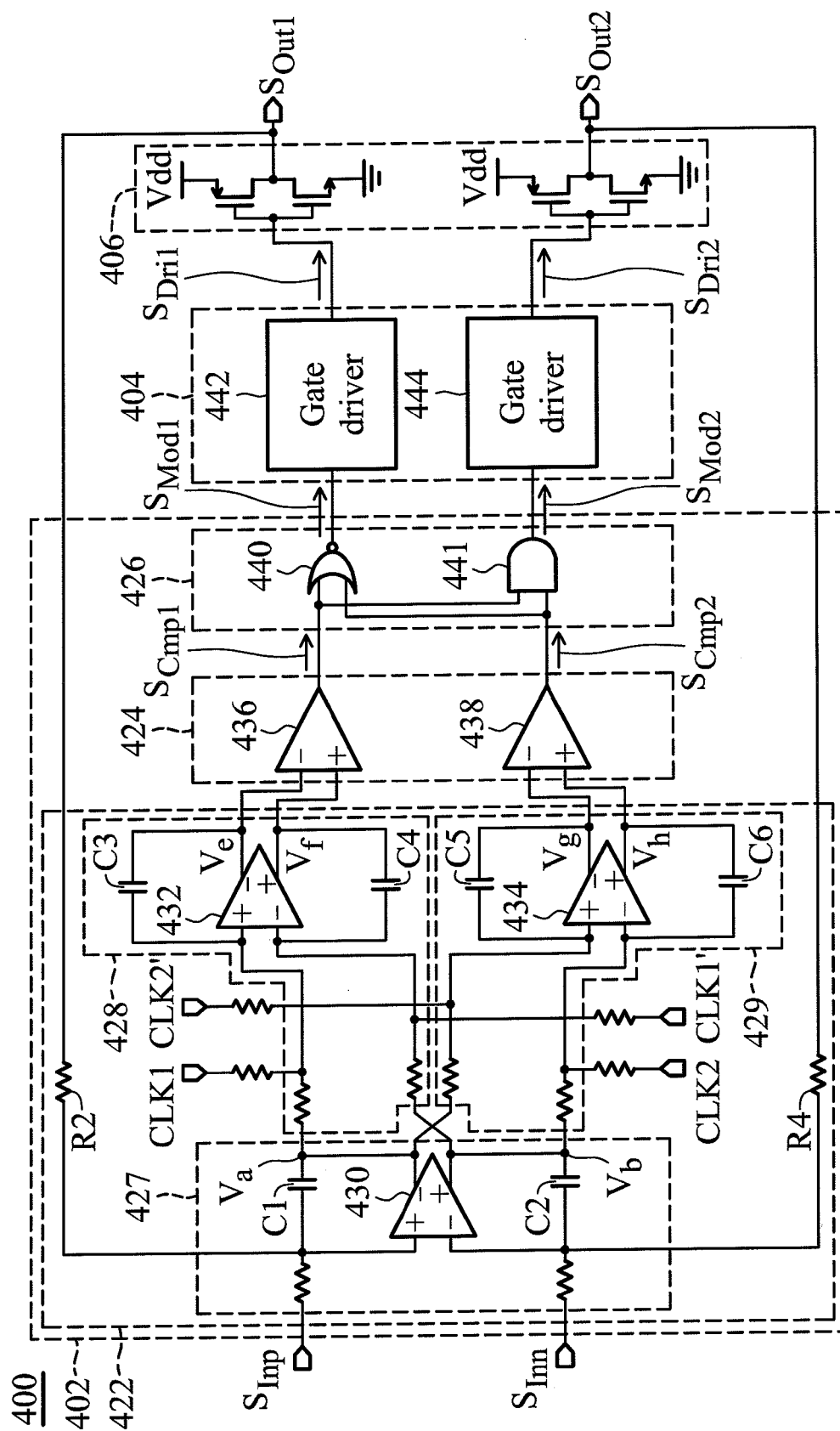
FIG. 4 shows a detailed circuit diagram of the amplifier circuit according to an embodiment of the invention.

FIG. 4 shows a detailed circuit diagram of the amplifier circuit according to an embodiment of the invention. The amplifier circuit 400 comprises a modulation signal generating circuit 402, a driving stage circuit 404 and an output stage circuit 406. The modulation signal generating circuit 402 generates a pair of modulation signals $S_{Mod1}$ and $S_{Mod2}$ according to a pair of differential input signals $S_{Inp}$ and $S_{Inn}$ and a pair of clock signals CLK1/CLK1' and CLK2/CLK2'. The driving stage circuit 404 generates a pair of driving signals $S_{Dri1}$ and $S_{Dri2}$ according to the pair of modulation signals $S_{Mod1}$ and $S_{Mod2}$, respectively. The output stage circuit 406 generates a pair of amplified output signals $S_{Out1}$ and $S_{Out2}$ according to the pair of driving signals $S_{Dri1}$ and $S_{Dri2}$, respectively.

As shown in FIG. 4, the modulation signal generating circuit 402 comprises a two-order integration circuit 422, a comparator circuit 424 and a logic circuit 426. The output stage circuit 406 comprises a plurality of power transistors. The driving stage circuit 404 comprises gate drivers 442 and 444 each being respectively coupled to a gate of the power transistors for driving the corresponding power transistors according to the driving signals $S_{Dri1}$ and $S_{Dri2}$.

According to an embodiment of the invention, the two-order integration circuit 422 comprises at least a pair of feedback resistors R2 and R4, each being respectively coupled between a pair of output nodes and a pair of input nodes of the amplifier circuit 400, for feeding the pair of amplified output signals $S_{Out1}$ and $S_{Out2}$ back to the pair of input nodes of the amplifier circuit 400. The two-order integration circuit 422 further comprises fully differential error amplifiers 430, 432 and 434. The fully differential error amplifiers 430, 432 and 434 accompanying with the feedback resistors R2 and R4 and the capacitors C1 and C2, C3 and C4, and C5 and C6 form the two-order integration circuit. The first order integration circuit comprises a first integrator 427, which is formed by the fully differential error amplifier 430 and corresponding capacitors and resistors, and the second order integration circuit comprises a second integrator 428 and a third integrator 429, which is respectively formed by the fully differential error amplifiers 432 and 434 and corresponding capacitors and resistors.

According to an embodiment of the invention, the first integrator is coupled to the pair of input nodes of the amplifier circuit 400 for generating a first pair of integration signals at a pair of differential output nodes Va and Vb according to the pair of differential input signals $S_{Inp}$ and $S_{Inn}$ and the pair of amplified output signals $S_{Out1}$ and $S_{Out2}$ which are fed back to the pair of input nodes. The second integrator is coupled to the pair of differential output nodes Va and Vb of the first integrator and a clock input node for receiving the clock signal CLK1/CLK1', and generates a second pair of integration signals at a pair of differential output nodes Ve and Vf according to the first pair of integration signals and the clock signal CLK1/CLK1'. The third integrator is also coupled to the pair of differential output nodes Va and Vb of the first integrator and a clock input node for receiving the clock signal CLK2/CLK2', and generates a third pair of integration signals at a pair of differential output nodes Vg and Vh according to the first pair of integration signals and the clock signal CLK2/CLK2'.

Figure 5B:
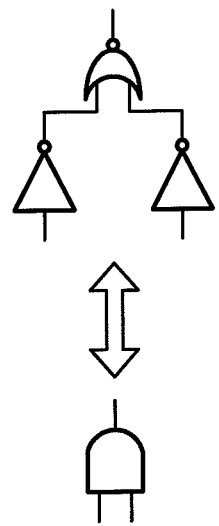
FIG. 5b shows the equivalent logic gates for a AND gate.
Figure 5A:
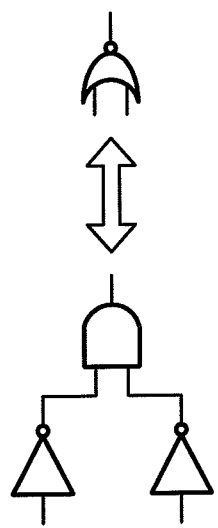
FIG. 5a shows the equivalent logic gates for a NOR gate.

The comparator circuit 424 comprises comparators 436 and 438. The comparator 436 is coupled to the pair of differential output nodes Ve and Vf of the second integrator for comparing the second pair of integration signals to generate the comparison signal $S_{Cmp1}$. The comparator 438 is coupled to the pair of differential output nodes Vg and Vh of the third integrator for comparing the third pair of integration signals to generate the comparison signal $S_{Cmp2}$. The logic circuit 426 comprises a NOR gate 440 and an AND gate 441, for respectively performing logic operations on the comparison signals $S_{Cmp1}$ and $S_{Cmp2}$ to generate the modulation signals $S_{Mod1}$ and $S_{Mod2}$. It should be noted that the invention should not be limited to the NOR gate and AND gate as shown in FIG. 4. FIG. 5a and FIG. 5b show the equivalent logic gates for the NOR gate and AND gate. In some embodiments of the invention, the NOR gate 440 and an AND gate 441 as shown in FIG. 4 may be replaced by the logic gates shown in FIG. 5a and FIG. 5b, or other logic gates. Therefore, the invention scope should not be limited to the NOR gate 440 and an AND gate 441 as shown in FIG. 4.

Figure 6A:
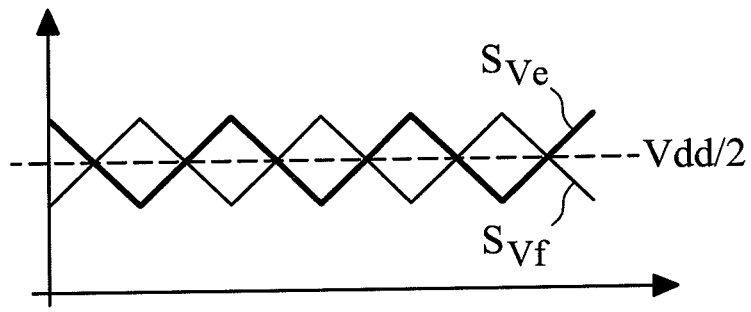
FIG. 6a shows exemplary waveforms of the second pair of integration signals according to an embodiment of the invention.
Figure 7A:
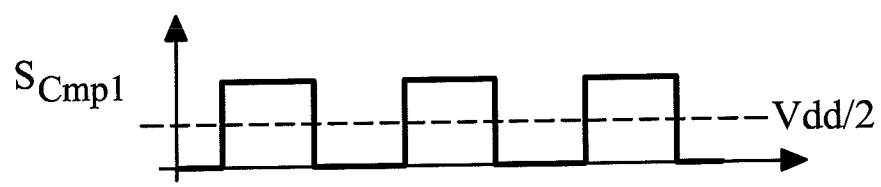
FIG. 7a shows exemplary waveform of comparison signal $S_{Cmp1}$ according to an embodiment of the invention.
Figure 6B:
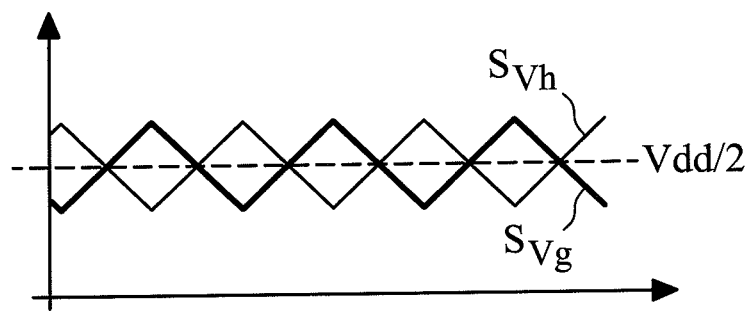
FIG. 6b shows exemplary waveforms of the third pair of integration signals according to an embodiment of the invention.
Figure 7B:
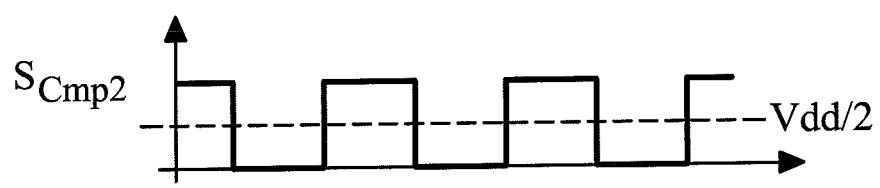
FIG. 7b shows exemplary waveform of comparison signal $S_{Cmp2}$ according to an embodiment of the invention.

FIG. 6a shows exemplary waveforms of the second pair of integration signals $S_{Ve}$ and $S_{Vf}$ generated at the differential output nodes Ve and Vf according to an embodiment of the invention. FIG. 6b shows exemplary waveforms of the third pair of integration signals $S_{Vg}$ and $S_{Vh}$ generated at the differential output nodes Vg and Vh according to an embodiment of the invention. The second pair of integration signals $S_{Ve}$ and $S_{Vf}$ are the integration signals outputted from the differential output nodes Ve and Vf and the third pair of integration signals $S_{Vg}$ and $S_{Vh}$ are the integration signals outputted from the differential output nodes Vg and Vh. The comparators 436 and 438 respectively compares the levels of the integration signals $S_{Ve}$ and $S_{Vf}$, and $S_{Vg}$ and $S_{Vh}$, and generate the comparison signal $S_{Cmp1}$ as shown in FIG. 7a and the comparison signal $S_{Cmp2}$ as shown in FIG. 7b. The logic circuit performs NOR and AND logic operations on the comparison signals $S_{Cmp1}$ and $S_{Cmp2}$, and obtains the modulation signal $S_{Mod1}$ as shown in FIG. 8a and the modulation signal $S_{mod2}$ as shown in FIG. 8b.

Figure 8A:
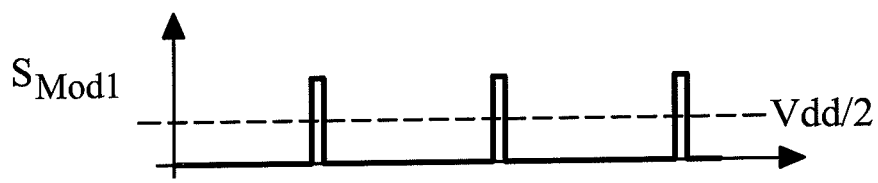
FIG. 8a shows exemplary waveform of modulation signal $S_{Mod1}$ according to an embodiment of the invention.
Figure 8B:
FIG. 8b shows exemplary waveform of modulation signal $S_{Mod2}$ according to an embodiment of the invention.

According to an embodiment of the invention, FIG. 6 to FIG. 8 show the waveforms of output signals of each circuit when there is no alternating current (AC) signal input to the circuits, wherein no AC signal input means the level difference between the output signals at the differential output nodes Va and Vb is 0. As shown in FIG. 8a and FIG. 8b, when there is no AC signal input, both the modulation signals $S_{Mod1}$ and $S_{Mod2}$ comprise pulses which are very narrow in width.

Figure 9A:
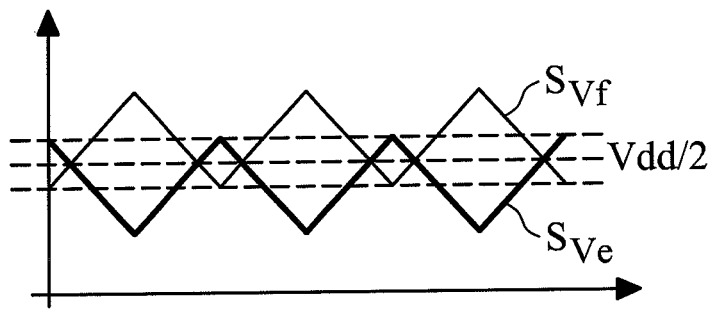
FIG. 9a shows exemplary waveforms of the second pair of integration signals according to another embodiment of the invention.
Figure 10A:
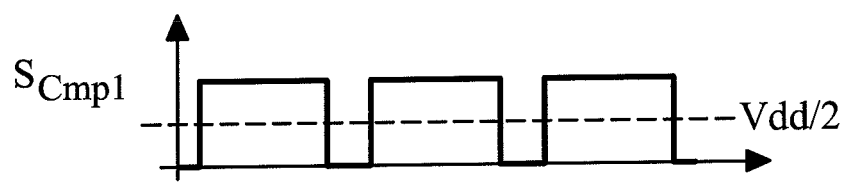
Figure 11A:
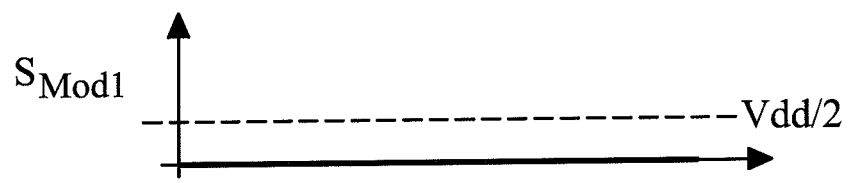
FIG. 11a shows exemplary waveform of modulation signal $S_{Mod1}$ according to another embodiment of the invention.
Figure 9B:
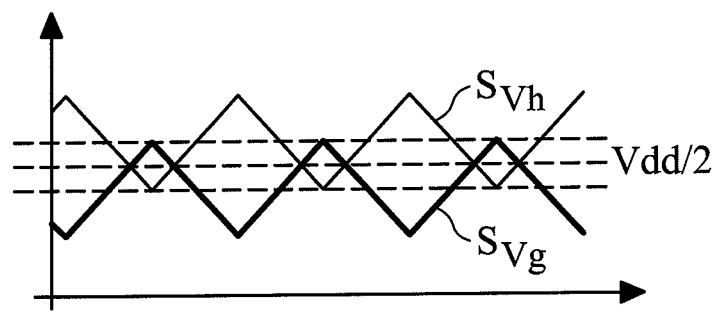
FIG. 9b shows exemplary waveforms of the third pair of integration signals according to another embodiment of the invention.
Figure 10B:
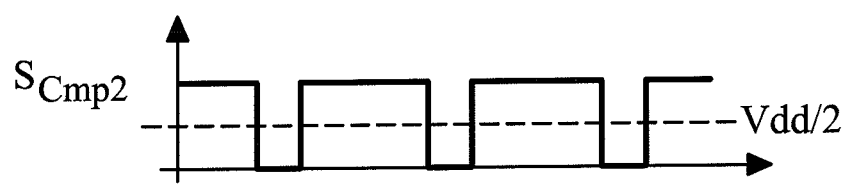
FIG. 10b shows exemplary waveform of the comparison signal $S_{Cmp2}$ generated based on the integration signals as shown in FIG. 9b.
Figure 11B:
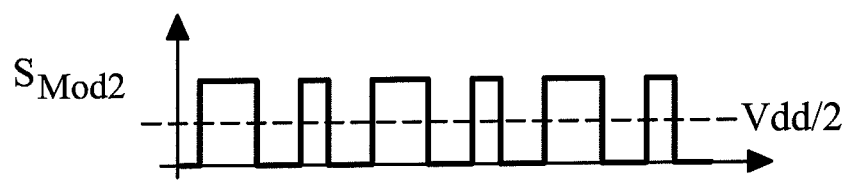
FIG. 11b shows exemplary waveform of modulation signal $S_{Mod2}$ according to another embodiment of the invention.

FIG. 9a shows exemplary waveforms of the second pair of integration signals $S_{Ve}$ and $S_{Vf}$ according to another embodiment of the invention. FIG. 9b shows exemplary waveforms of the third pair of integration signals $S_{Vg}$ and $S_{Vh}$ according to another embodiment of the invention. In this embodiment, there is an AC signal input to the circuits and a level of the output signal at the differential output node Va is greater than that at the differential output node Vb (in other words, the level difference between the output signals at the differential output nodes Va and Vb is greater than 0). FIG. 10a shows the waveform of the comparison signal $S_{Cmp1}$ generated based on the integration signals $S_{Ve}$ and $S_{Vf}$ as shown in FIG. 9a. FIG. 10b shows the waveform of the comparison signal $S_{Cmp2}$ generated based on the integration signals $S_{Vg}$ and $S_{Vh}$ as shown in FIG. 9b. Finally, the logic circuit performs NOR and AND logic operations on the comparison signals $S_{Cmp1}$ and $S_{Cmp2}$ and obtains the modulation signal $S_{Mod1}$ as shown in FIG. 11a and the modulation signal $S_{Mod2}$ as shown in FIG. 11b. As shown in FIG. 11a and FIG. 11b, when the level difference between the output signals at the differential output nodes Va and Vb is greater than 0, the modulation signal $S_{Mod1}$ is always 0.

Figure 12A:
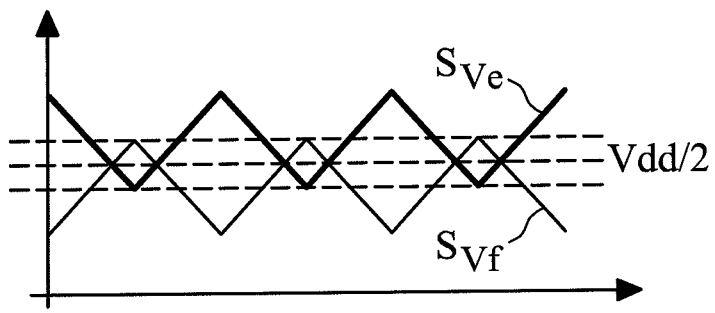
FIG. 12a shows exemplary waveforms of the second pair of integration signals according to yet another embodiment of the invention.
Figure 13A:
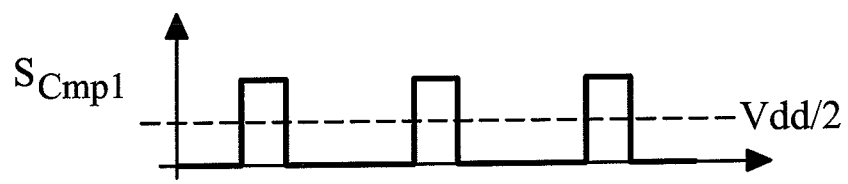
Figure 14A:
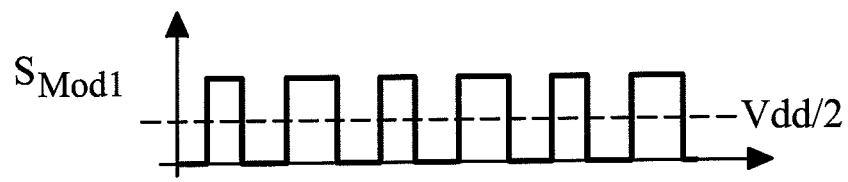
FIG. 14a shows exemplary waveform of modulation signal $S_{Mod1}$ according to another embodiment of the invention.
Figure 12B:
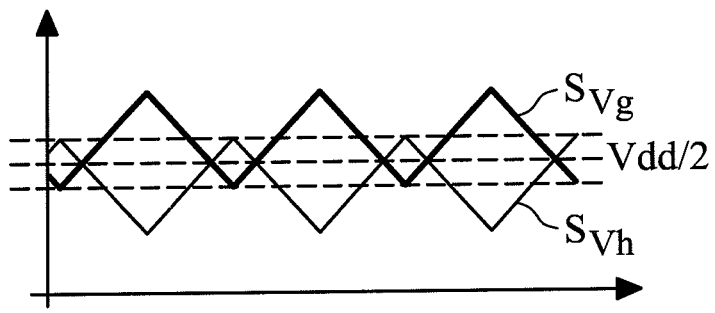
FIG. 12b shows exemplary waveforms of the third pair of integration signals according to yet another embodiment of the invention.
Figure 13B:
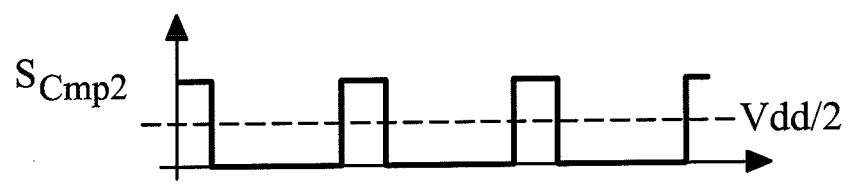
FIG. 13b shows exemplary waveform of the comparison signal $S_{Cmp2}$ generated based on the integration signals as shown in FIG. 12b.
Figure 14B:
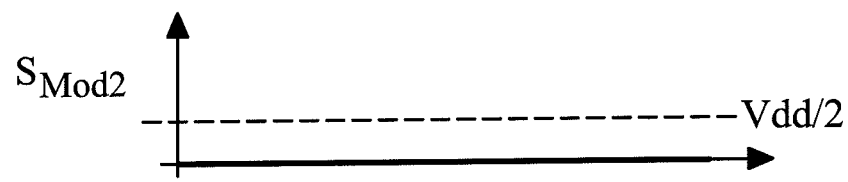
FIG. 14b shows exemplary waveform of modulation signal $S_{Mod2}$ according to another embodiment of the invention.

FIG. 12a shows exemplary waveforms of the second pair of integration signals $S_{Ve}$ and $S_{Vf}$ according to yet another embodiment of the invention. FIG. 12b shows exemplary waveforms of the third pair of integration signals $S_{Vg}$ and $S_{Vh}$ according to yet another embodiment of the invention. In this embodiment, there is an AC signal input to the circuits and a level of the output signal at the differential output node Va is smaller than that at the differential output node Vb (in other words, the level difference between the output signals at the differential output nodes Va and Vb is less than 0). FIG. 13a shows the waveform of the comparison signal $S_{Cmp1}$ generated based on the integration signals $S_{Ve}$ and $S_{Vf}$ shown in FIG. 12a. FIG. 13b shows the waveform of the comparison signal $S_{Cmp2}$ generated based on the integration signals $S_{Vg}$ and $S_{Vh}$ shown in FIG. 12b. Finally, the logic circuit performs NOR and AND logic operations on the comparison signals $S_{Cmp1}$ and $S_{Cmp2}$ and obtains the modulation signal $S_{Mod1}$ as shown in FIG. 14a and the modulation signal $S_{Mod2}$ as shown in FIG. 14b. As shown in FIG. 14a and FIG. 14b, when the level difference between the output signals at the differential output nodes Va and Vb is less than 0, the modulation signal $S_{mod2}$ is always 0.

From FIG. 8a and FIG. 8b, FIG. 11a and FIG. 11b and FIG. 14a and FIG. 14b, it can be noted that different from the pulse width modulation (PWM) signals outputted by the conventional class D amplifier, the modulation signals $S_{Mod1}$ and $S_{Mod2}$ outputted by the proposed amplifier circuit may comprise narrow pulses when there is no AC signal input, and one of them may always be 0 when there is any AC signal input. In this manner, the EMI of the amplified output signal can be greatly reduced while the signal level (i.e. strength) of the modulation signals can remain unchanged because the modulation signals can have a narrower pulse width than in a conventional class D amplifier, or can even be 0.

Figure 1:
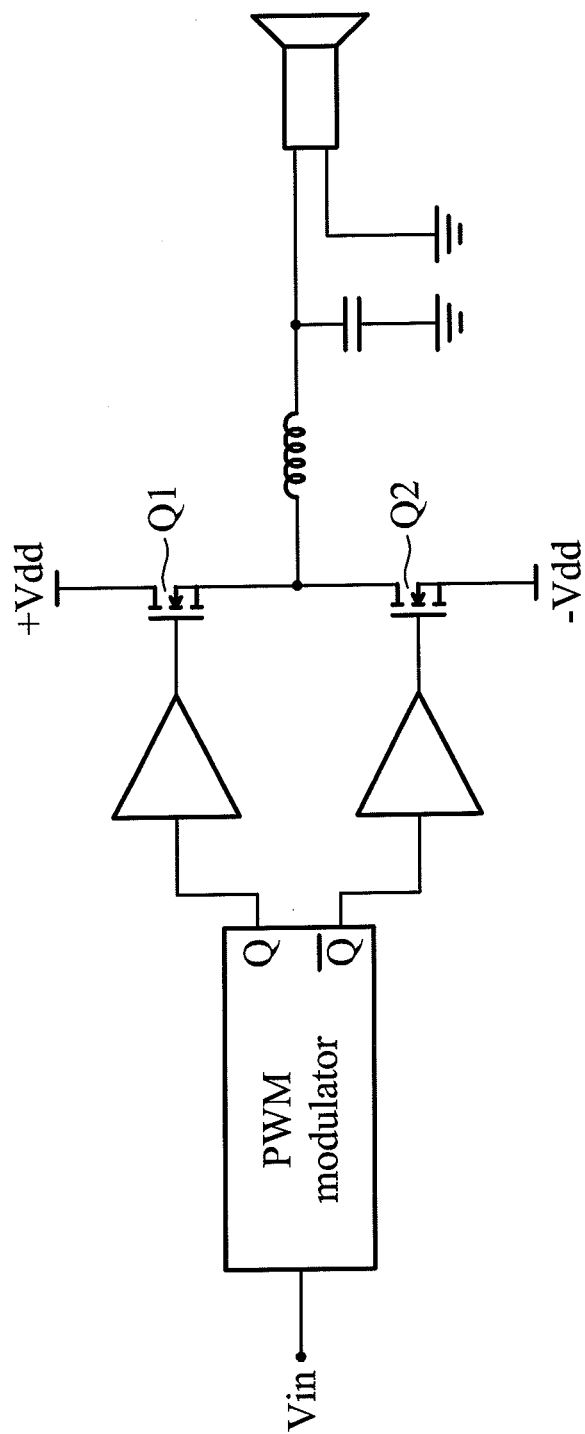
FIG. 1 shows a basic circuit diagram of a class D amplifier.

In addition, as shown in FIG. 1, the PWM modulator in the conventional class D amplifier requires an extra triangle wave generator to generate a triangle wave with a predetermined frequency. The triangle wave generator is generally not easy to design. However, as shown in FIG. 6a and FIG. 6b, FIG. 9a and FIG. 9b, and FIG. 12a and FIG. 12b, the triangle waves have been generated in the modulation procedure of the modulation signal generating circuit and have been carried onto the integration signals $S_{Ve}$, $S_{Vf}$, $S_{Vg}$ and $S_{Vg}$. Therefore, in the proposed amplifier circuit, the extra triangle wave generator is not required. As long as the clock signals CLK1/CLK2 are input, the modulation signals can be generated.

Figure 15B:
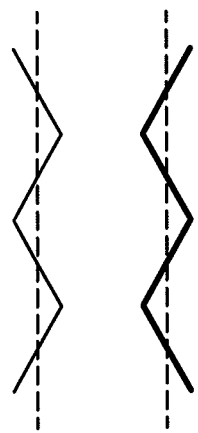
FIG. 15b shows exemplary waveforms of the integration signals generated based on a clock signal and a reference voltage according to another embodiment of the invention.
Figure 15A:
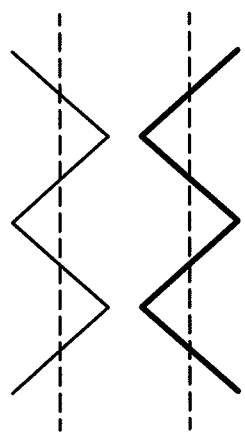
FIG. 15a shows exemplary waveforms of the integration signals generated based on a pair of clock signals according to an embodiment of the invention.

In the above-mentioned embodiments, the second order integration circuit (comprising the second integrator and the third integrator) generates the integration signals $S_{Ve}$, $S_{Vf}$, $S_{Vg}$ and $S_{Vh}$ according to a pair of clock signals CLK1/CLK1' and CLK2/CLK2'. According to another embodiment of the invention, one of the clock signals may also be replaced by a reference voltage, and a similar modulation result may be obtained. FIG. 15a shows exemplary waveforms of the integration signals generated based on a pair of clock signals according to an embodiment of the invention. FIG. 15b shows exemplary waveforms of the integration signals generated based on a clock signal and a reference voltage according to another embodiment of the invention, where the reference voltage may be designed as a half of the operation voltage Vdd of the amplifier circuit (that is, Vdd/2). Comparing the waveforms of the integration signals as shown in FIG. 15a and FIG. 15b, it can be noted that the difference is only in the amplitudes of the signal waveforms, where the integration signals generated based on the reference voltage have relatively smaller amplitudes.

It is noted that based on the spirit of the invention, in the embodiment where one of the clock signals is replaced by the reference voltage $V_{Ref}$, the similar modulation results may be obtained as long as one input node of the second and third integrators is designed to receive the reference voltage $V_{Ref}$ and the other one input node is designed to receive two of the clock signals CLK1, CLK1', CLK2 and CLK2', where there should be a phase difference td between the clock signals received by the second and third integrators. As previously described, the phase difference td may be arbitrarily determined as any number greater than a sum of the overall propagation delay of the amplifier circuit and the dead time of the output stage circuit. Therefore, the circuits shown in the following FIG. 16-FIG. 19 are just part of a variety embodiments of the invention and the scope of the invention should not be limited thereto.

Figure 16:
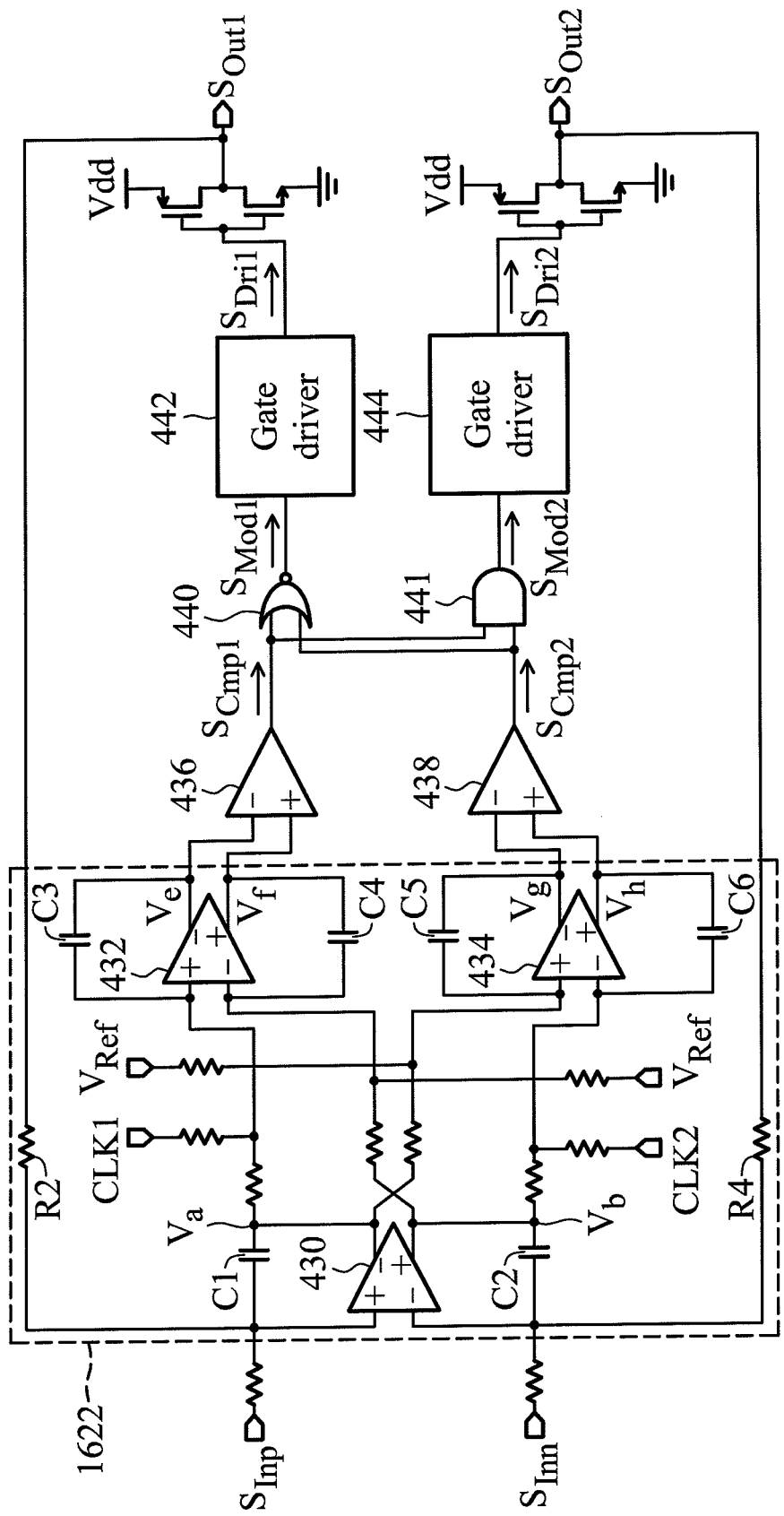
FIG. 16 shows a detailed circuit diagram of the amplifier circuit according to another embodiment of the invention.

FIG. 16 shows a detailed circuit diagram of the amplifier circuit according to another embodiment of the invention. Most of the elements in the amplifier circuit 1600 shown in FIG. 16 are the same as the elements in the amplifier circuit 400 shown in FIG. 4. Therefore, details of the amplifier circuit may refer to FIG. 4, and are omitted here for brevity. In this embodiment, the two-order integration circuit 1622 receives the clock signals CLK1 and CLK2 and the reference voltage $V_{Ref}$, wherein the second integrator generates the integration signals $S_{Ve}$ and $S_{Vf}$ according to the output signals of the first integrator, the reference voltage $V_{Ref}$ and the clock signal CLK1, and the third integrator generates the integration signals $S_{Vg}$ and $S_{Vh}$ according to the output signals of the first integrator, the reference voltage $V_{Ref}$ and the clock signal CLK2. The comparators 436 and 438 compare the levels of the integration signals $S_{Ve}$ and $S_{Vf}$ and $S_{Vg}$ and $S_{Vh}$ to generate the comparison signals $S_{Cmp1}$ and $S_{Cmp2}$, respectively. The logic circuit performs logic operations on the comparison signals $S_{Cmp1}$ and $S_{Cmp2}$ to generate the modulation signals $S_{Mod1}$ and $S_{Mod2}$.

Figure 17:
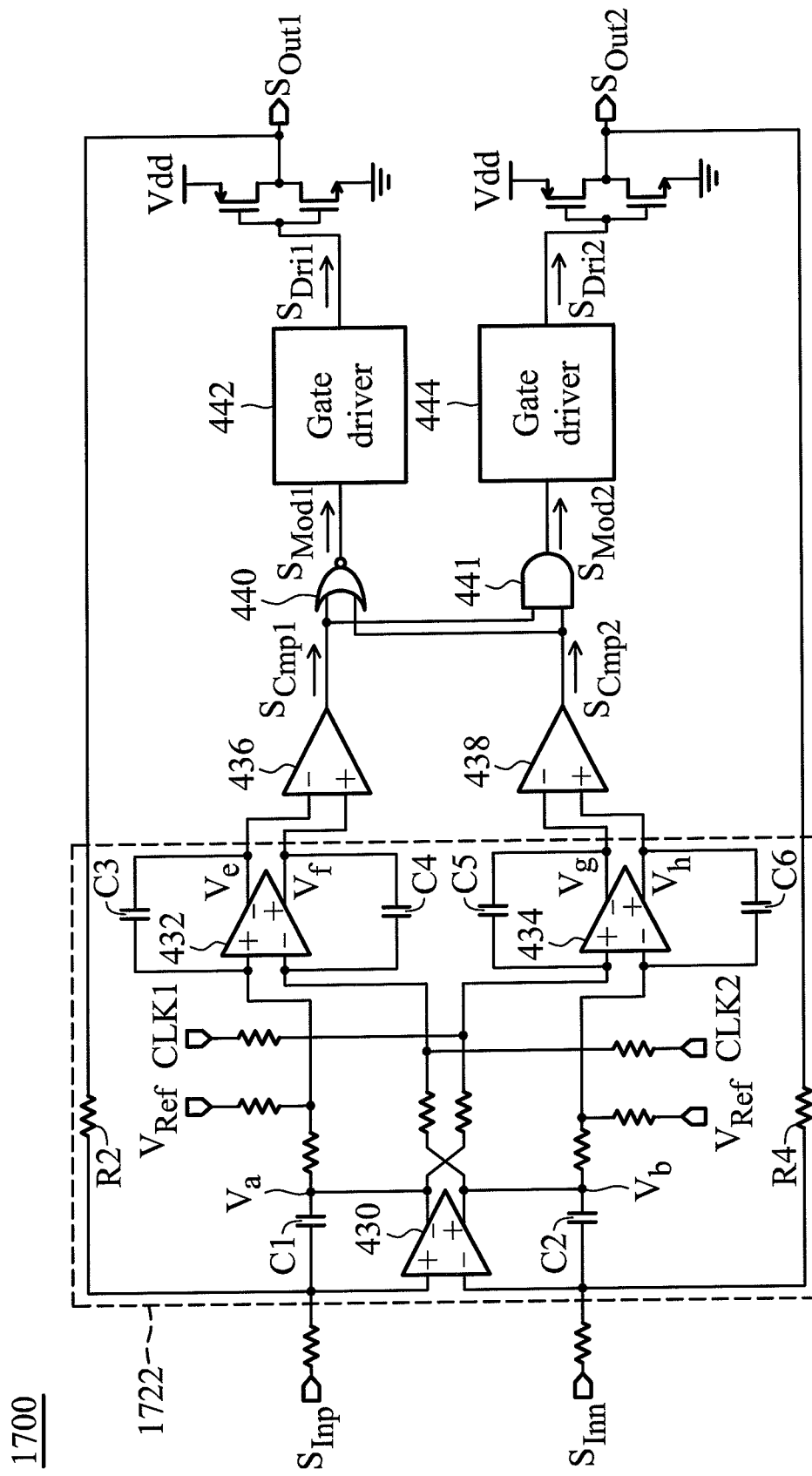
FIG. 17 shows a detailed circuit diagram of the amplifier circuit according to yet another embodiment of the invention.

FIG. 17 shows a detailed circuit diagram of the amplifier circuit according to yet another embodiment of the invention.

Most of the elements in the amplifier circuit 1700 shown in FIG. 17 are the same as the elements in the amplifier circuit 400 shown in FIG. 4. Therefore, details of the amplifier circuit may refer to FIG. 4, and are omitted here for brevity. In this embodiment, the two-order integration circuit 1722 receives the clock signals CLK1 and CLK2 and the reference voltage $V_{Ref}$, wherein the second integrator generates the integration signals $S_{Ve}$ and $S_{Vf}$ according to the output signals of the first integrator, the reference voltage $V_{Ref}$ and the clock signal CLK2, and the third integrator generates the integration signals $S_{Vg}$ and $S_{Vh}$ according to the output signals of the first integrator, the reference voltage $V_{Ref}$ and the clock signal CLK1. The comparators 436 and 438 compare the levels of the integration signals $S_{Ve}$ and $S_{Vf}$ and $S_{Vg}$ and $S_{Vh}$ to generate the comparison signals $S_{Cmp1}$ and $S_{Cmp2}$, respectively. The logic circuit performs logic operations on the comparison signals $S_{Cmp1}$ and $S_{Cmp2}$ to generate the modulation signals $S_{Mod1}$ and $S_{Mod2}$.

Figure 18:
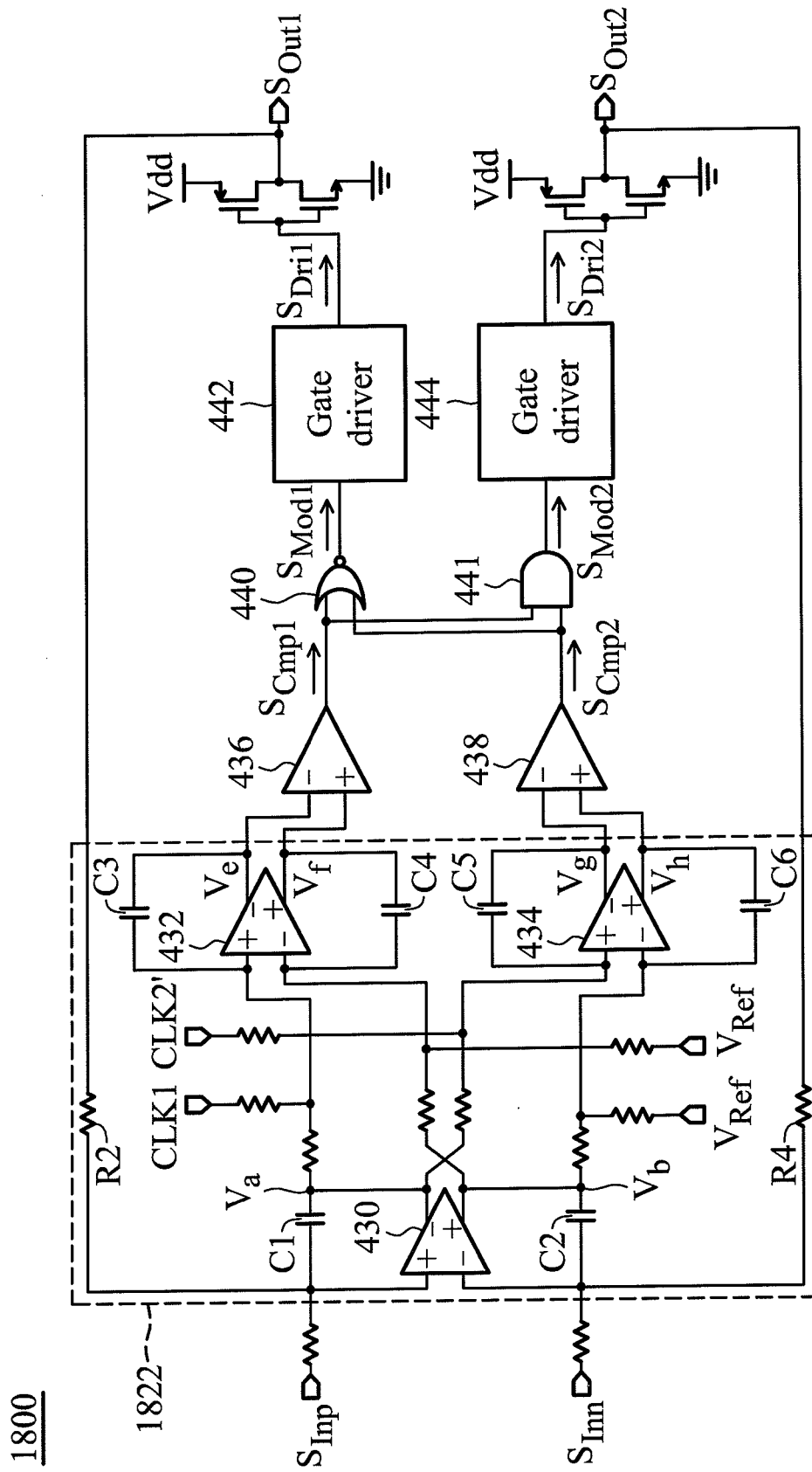
FIG. 18 shows a detailed circuit diagram of the amplifier circuit according to yet another embodiment of the invention.

FIG. 18 shows a detailed circuit diagram of the amplifier circuit according to yet another embodiment of the invention. Most of the elements in the amplifier circuit 1800 shown in FIG. 18 are the same as the elements in the amplifier circuit 400 shown in FIG. 4. Therefore, details of the amplifier circuit may refer to FIG. 4, and are omitted here for brevity. In this embodiment, the two-order integration circuit 1822 receives the clock signals CLK1 and CLK2 and the reference voltage $V_{Ref}$, wherein the second integrator generates the integration signals $S_{Ve}$ and $S_{Vf}$ according to the output signals of the first integrator, the reference voltage $V_{Ref}$ and the clock signal CLK1, and the third integrator generates the integration signals $S_{Vg}$ and $S_{Vh}$ according to the output, signals of the first integrator, the reference voltage $V_{Ref}$ and the clock signal CLK2'. The comparators 436 and 438 compare the levels of the integration signals $S_{Ve}$ and $S_{Vf}$ and $S_{Vg}$ and $S_{Vh}$ to generate the comparison signals $S_{Cmp1}$ and $S_{Cmp2}$, respectively. The logic circuit performs logic operations on the comparison signals $S_{Cmp1}$ and $S_{Cmp2}$ to generate the modulation signals $S_{Mod1}$ and $S_{Mod2}$.

Figure 19:
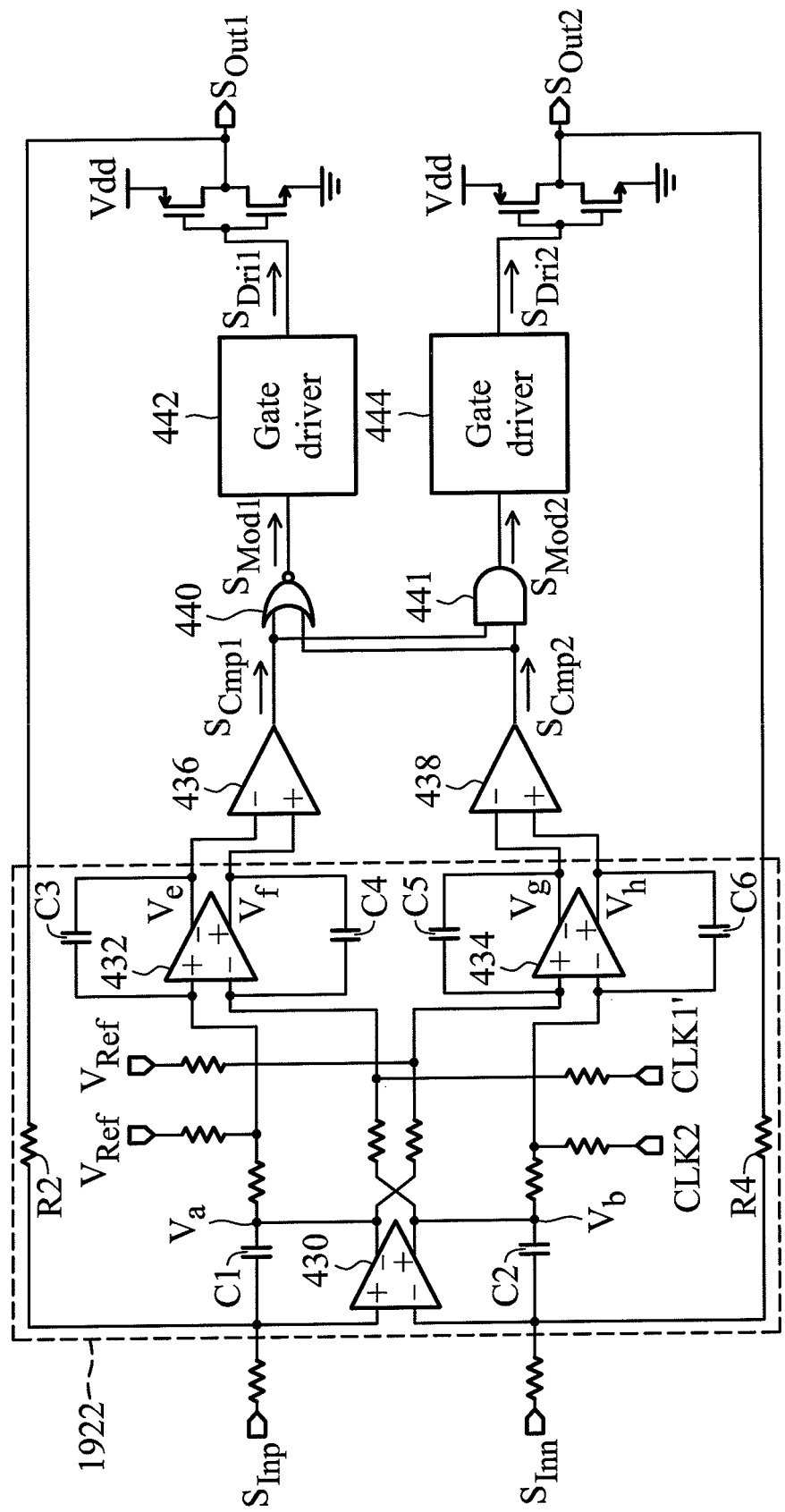
FIG. 19 shows a detailed circuit diagram of the amplifier circuit according to yet another embodiment of the invention.

FIG. 19 shows a detailed circuit diagram of the amplifier circuit according to yet another embodiment of the invention. Most of the elements in the amplifier circuit 1900 shown in FIG. 19 are the same as the elements in the amplifier circuit 400 shown in FIG. 4. Therefore, details of the amplifier circuit may refer to FIG. 4, and are omitted here for brevity. In this embodiment, the two-order integration circuit 1922 receives the clock signals CLK1 and CLK2 and the reference voltage $V_{Ref}$, wherein the second integrator generates the integration signals $S_{Ve}$ and $S_{Vf}$ according to the output signals of the first integrator, the reference voltage $V_{Ref}$ and the clock signal CLK1', and the third integrator generates the integration signals $S_{Vg}$ and $S_{Vh}$ according to the output signals of the first integrator, the reference voltage $V_{Ref}$ and the clock signal CLK2. The comparators 436 and 438 compare the levels of the integration signals $S_{Ve}$ and $S_{Vf}$ and $S_{Vg}$ and $S_{Vh}$ to generate the comparison signals $S_{Cmp1}$ and $S_{Cmp2}$, respectively. The logic circuit performs logic operations on the comparison signals $S_{Cmp1}$ and $S_{Cmp2}$ to generate the modulation signals $S_{Mod1}$ and $S_{Mod2}$.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An amplifier circuit, comprising:
a modulation signal generating circuit, generating a pair of modulation signals according to a pair of differential input signals and a pair of clock signals, wherein the pair of clock signals comprises a first clock signal and a second clock signal having a phase difference therebetween, and wherein the modulation signal generating circuit comprises a two-order integration circuit for generating a plurality of pairs of integration signals according to the pair of differential input signals and the pair of clock signals;
a driving stage circuit, generating a pair of driving signals according to the pair of modulation signals; and
an output stage circuit, generating a pair of amplified output signals according to the pair of driving signals.

2. The amplifier circuit as claimed in claim 1, wherein the phase difference is greater than a sum of a propagation delay of the amplifier circuit and a dead time of the output stage circuit.

3. The amplifier circuit as claimed in claim 1, wherein the modulation signal generating circuit further comprises:
a comparator circuit, comparing the pairs of integration signals to generate a pair of comparison signals; and
a logic circuit, generating the pair of modulation signals according to logic operation results of the pair of comparison signals,
wherein the logic circuit comprises a NOR gate and an AND gate,
wherein the NOR gate performs a NOR logic operation on the pair of comparison signals to generate a first modulation signal;
wherein the AND gate performs an AND logic operation on the pair of comparison signals to generate a second modulation signal.

4. The amplifier circuit as claimed in claim 3, wherein the two-order integration circuit comprises:
a pair of feedback resistors, coupled between a pair of output nodes outputting the pair of amplified output signals and a pair of input nodes receiving the pair of differential input signals and for feeding the pair of amplified output signals back to the pair of input nodes;
a first integrator, coupled to the pair of input nodes for generating a first pair of integration signals according to the pair of differential input signals and the pair of amplified output signals fed back to the pair of input nodes;
a second integrator, coupled to the first integrator for generating a second pair of integration signals according to the first pair of integration signals and the first clock signal; and
a third integrator, coupled to the first integrator for generating a third pair of integration signals according to the first pair of integration signals and the second clock signal,
wherein the comparator circuit comprises a first comparator and a second comparator,
wherein the first comparator compares the second pair of integration signals to generate a first comparison signal, and
wherein the second comparator compares the third pair of integration signals to generate a second comparison signal.

5. The amplifier circuit as claimed in claim 3, wherein the two-order integration circuit comprises:
a pair of feedback resistors, coupled between a pair of output nodes outputting the pair of amplified output signals and a pair of input nodes receiving the pair of differential input signals and for feeding the pair of amplified output signals back to the pair of input nodes;
a first integrator, coupled to the pair of input nodes for generating a first pair of integration signals according to the pair of differential input signals and the pair of amplified output signals fed back to the pair of input nodes;
a second integrator, coupled to the first integrator for generating a second pair of integration signals according to the first pair of integration signals, a reference voltage and the first clock signal; and
a third integrator, coupled to the first integrator for generating a third pair of integration signals according to the first pair of integration signals, the reference voltage and the second clock signal,
wherein the comparator circuit comprises a first comparator and a second comparator,
wherein the first comparator compares the second pair of integration signals to generate a first comparison signal, and
wherein the second comparator compares the third pair of integration signals to generate a second comparison signal.

6. A modulation signal generating circuit, comprising:
a two-order integration circuit, generating a plurality of pairs of integration signals according to a pair of differential input signals and a pair of clock signals, wherein the pair of clock signals comprises a first clock signal and a second clock signal having a phase difference therebetween;
a comparator circuit, comparing the pairs of integration signals to generate a pair of comparison signals; and
a logic circuit, generating a pair of modulation signals according to logic operation results of the pair of comparison signals.

7. The modulation signal generating circuit as claimed in claim 6, wherein the two-order integration circuit comprises:
a first integrator, coupled to a pair of input nodes for receiving the pair of differential input signals;
a second integrator, coupled to a pair of differential output nodes of the first integrator and a first clock input node of the first integrator for receiving the first clock signal; and
a third integrator, coupled to the pair of differential output nodes of the first integrator and a second clock input node of the first integrator for receiving the second clock signal,
wherein the comparator circuit comprises a first comparator and a second comparator, the first comparator is coupled to a pair of differential output nodes of the second integrator and the second comparator is coupled to a pair of differential output nodes of the third integrator,
wherein the logic circuit comprises a NOR gate and an AND gate, the NOR gate is coupled to an output node of the first comparator and an output node of the second comparator and the AND gate is coupled to the output node of the first comparator and the output node of the second comparator.

8. The modulation signal generating circuit as claimed in claim 7, wherein the first integrator generates a first pair of integration signals according to the pair of differential input signals and a pair of feedback signals, the second integrator generates a second pair of integration signals according to the first pair of integration signals and the first clock signal, and the third integrator generates a third pair of integration signals according to the first pair of integration signals and the second clock signal, and wherein the second integrator is further coupled to a reference voltage for generating the second pair of integration signals according to the first pair of integration signals, the reference voltage and the first clock signal, and the third integrator is further coupled to the reference voltage for generating the third pair of integration signals according to the first pair of integration signals, the reference voltage and the second clock signal.

9. A modulation signal generating circuit, comprising:
 a first order integration circuit, generating a first pair of integration signals according to a pair of differential input signals;
 a second order integration circuit, generating a second pair of integration signals and a third pair of integration signals according to the first pair of integration signals and a pair of clock signals;
 a comparator circuit, comparing the second and third pairs of integration signals to generate a pair of comparison signals; and
 a logic circuit, generating a pair of modulation signals according to logic operation results of the pair of comparison signals.

10. The modulation signal generating circuit as claimed in claim 9, wherein the pair of clock signals comprises a first clock signal and a second clock signal having a phase difference therebetween, the first order integration circuit comprises:
 a first integrator, coupled to a pair of input nodes for receiving the pair of differential input signals, and
 the second order integration circuit comprises:
 a second integrator, coupled to a pair of differential output nodes of the first integrator and a first clock input node of the first integrator for receiving the first clock signal; and
 a third integrator, coupled to the pair of differential output nodes of the first integrator and a second clock input node of the first integrator for receiving the second clock signal.

11. The modulation signal generating circuit as claimed in claim 10, wherein the comparator circuit comprises:
 a first comparator, coupled to a pair of differential output nodes of the second integrator; and
 a second comparator, coupled to a pair of differential output nodes of the third integrator, and
 wherein the logic circuit comprises:
 a NOR gate, coupled to an output node of the first comparator and an output node of the second comparator; and
 an AND gate, coupled to the output node of the first comparator and the output node of the second comparator.

12. The modulation signal generating circuit as claimed in claim 10, wherein the first integrator generates the first pair of integration signals according to the pair of differential input signals and a pair of feedback signal, the second integrator generates the second pair of integration signals according to the first pair of integration signals and the first clock signal and the third integrator generates the third pair of integration signals according to the first pair of integration signals and the second clock signal, and wherein the second integrator is further coupled to a reference voltage for generating the second pair of integration signals according to the first pair of integration signals, the reference voltage and the first clock signal, and the third integrator is further coupled to the reference voltage for generating the third pair of integration signals according to the first pair of integration signals, the reference voltage and the second clock signal.

* * * * *